United States Patent [19]

Gordon et al.

[11] 3,833,903

[45] Sept. 3, 1974

[54] COMPENSATED VOLTAGE-CONTROLLED OSCILLATOR PARTICULARLY FOR ANALOG TO DIGITAL CONVERTERS

[75] Inventors: Bernard M. Gordon, Magnolia; Leopold Neumann, Lexington; Ivan H. Kirsch, Hyde Park, all of Mass.

[73] Assignee: Gordon Engineering Company, Wakefield, Mass.

[22] Filed: Jan. 2, 1973

[21] Appl. No.: 320,639

[52] U.S. Cl......... 340/347 AD, 324/99 D, 331/177, 332/16, 332/1

[51] Int. Cl......................................... H03k 13/20

[58] Field of Search........... 340/347 AD; 332/16, 1, 332/14; 235/183; 331/177; 324/99 D

[56] References Cited

UNITED STATES PATENTS

| | | | |
|---|---|---|---|
| 3,036,299 | 5/1962 | Uphoff | 340/347 AD |
| 3,040,273 | 6/1962 | Boff | 332/1 X |
| 3,136,990 | 6/1964 | Howe | 340/347 AD |
| 3,198,961 | 8/1965 | Millsap | 340/347 AD X |
| 3,201,781 | 8/1965 | Holland | 340/347 AD |
| 3,319,243 | 5/1967 | Anderson | 340/347 AD |
| 3,349,391 | 10/1967 | Kimura | 340/347 AD |
| 3,375,351 | 3/1968 | Deavenport et al. | 340/347 AD X |
| 3,378,833 | 4/1968 | Anderson | 340/347 AD |
| 3,719,807 | 3/1973 | Daley | 340/347 AD |

*Primary Examiner*—Charles D. Miller
*Attorney, Agent, or Firm*—Morse, Altman, Oates & Bello

[57] ABSTRACT

A voltage-controlled oscillator of general applicability comprises a charge switching circuit for generating a signal of precise frequency. Selected components provide temperature compensation for stable operation. An analog to digital converter comprises a floating analog section and a grounded digital section, the analog section including a voltage-controlled oscillator of the aforementioned type and the digital section including a time base generator and a programmable counter. In the voltage-controlled oscillator, an analog input signal is translated to a proportional current and a pulsed signal having a functionally related frequency is generated. The pulsed signal is coupled to the grounded digital section through a coupling transformer, which also couples a timing signal generated by the time base generator for synchronizing the floating analog section and the grounded digital section. The coupled pulse signal is added to the timing signal and applied to the counter which is gated to respond to only those pulses occuring within a selected time interval. Tracking components in the voltage-controlled oscillator and time base generator operate to compensate for a frequency change of the pulsed signal due to the effects of temperature by a counteracting change of the selected time interval to which the counter is responsive. Selective programming of the counter provides digital form signals in arbitrary engineering units.

21 Claims, 5 Drawing Figures

COMPENSATED VOLTAGE-CONTROLLED OSCILLATOR PARTICULARLY FOR ANALOG TO DIGITAL CONVERTERS

BACKGROUND OF THE INVENTION

1. Field of the Invention

The present invention relates to electronic devices and more particularly, is directed towards a stable voltage-controlled oscillator and an analog to digital converter utilizing such an oscillator.

2. Description of the Prior Art

Design engineers have had the option of selecting either a digital panel meter or an analog panel meter, the latter being much more widely used heretofore than the former. The analog panel meter has the advantages of a free-floating analog front-end, the ability to measure low level signals without amplification and the capability of scaling by the addition of external shunts or multipliers to read in arbitrary engineering units. The digital panel meter has the advantages of improved resolution and unambiguous digital readout, by which a skilled operator may be unnecessary, and a digital output for driving printers, computers and other system components.

Notwithstanding their desirable features, digital panel meters have not been widely used primarily because of their complexity and cost. Conventional methods of converting analog input signal to digital forms, for example, dual slope conversion, registered programmed successive-approximation, ramp conversion, unidirectional counter-driven digital to analog conversion, forward/backward driven digital to analog conversion with digital servos, voltage-controlled oscillator conversion, and hybrid conversion have provided complex and costly digital panel meters.

Accordingly, there is a need for a simple and inexpensive analog to digital converter that incorporates the desirable features of both analog and digital meters.

SUMMARY OF THE INVENTION

It is an object of the present invention to provide a precision self-synchronized voltage-controlled oscillator of general applicability comprising a voltage to current converter and a current to count converter for generating a pulsed signal of precise frequency. The voltage to current converter translates an input signal to a proportional current and the current to count converter generates a pulsed signal having a functionally related frequency. The current to count converter is characterized by a charge switching circuit that includes temperature compensating components for stable voltage-controlled oscillator operation. Charging and discharging of a capacitor in the current to count converter is selectively controlled by a switching circuit, a pulse generated for each negative going transition of the capacitor voltage in the current to count converter.

It is another object of the present invention to provide an analog to digital converter characterized by a floating analog section and a grounded digital section, the analog section including a voltage-controlled oscillator of the aforementioned type and the digital section including a time base generator and a programmable counter. The pulsed signal generated by the voltage-controlled oscillator is coupled from the floating analog section to the grounded digital section through a coupling transformer which also couples a timing signal generated by the time base generator to the voltage-controlled oscillator for synchronizing the floating analog section and grounded digital section by repetitive zeroing of the charge switching circuit. The coupled pulsed signal is added to the inverted version of the timing signal and applied to the counter which is gated to respond to only those pulses occuring within a selected time interval of the combined waveform. Tracking components in the voltage-controlled oscillator and time base generator compensate for a frequency change of the pulsed signal due to the effects of temperature by a counteracting change in the selected time interval to which the counter is responsive. Selective programming of the counter provides digital form signals in arbitrary engineering units.

It is still another object of the present invention to provide a digital panel meter comprising an analog to digital converter of the aforementioned type in combination with a display for visual presentation of the analog input signal in digital form.

The invention accordingly comprises the system possessing the construction, combination of elements, and arrangement of parts that are exemplified in the following detailed disclosure, the scope of which will be indicated in the appended claims.

BRIEF DESCRIPTION OF THE DRAWINGS

For a fuller understanding of the nature and objects of the present invention, reference should be had to the following detailed description taken in connection with the accompanying drawings wherein.

DETAILED DESCRIPTION OF THE INVENTION

Figure 1:
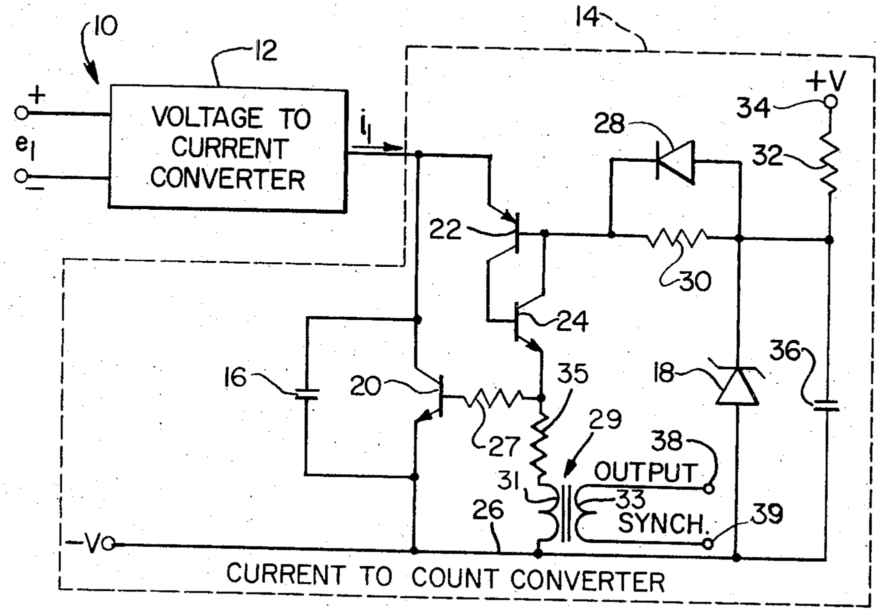
FIG. 1 is a block and schematic diagram of a voltage-controlled oscillator embodying the present invention.

Referring now to the drawings, particularly FIG. 1, there is shown a voltage controlled oscillator 10, of general applicability, comprising a voltage to current converter 12 and a current to count converter 14. Voltage to current converter 12 translates an input voltage $e_1$ into a proportional current $i_1$ and current to count converter 14 generates an output signal having a frequency that is functionally related to the proportional current $i_1$ by means of a charge switching circuit hereinafter described.

Current to count converter 14 comprises a capacitor 16, a diode 18, transistors 20, 22 and 24, and a transformer 29 including a primary winding 31 and a secondary winding 33. The proportional current $i_1$ is applied to the collector contact of transistor 20, one side of capacitor 16 and the emitter contact of transistor 22. The other side of capacitor 16 and the emitter contact of transistor 20 are connected to a return line 26. The base contact of transistor 20 is connected to the emitter contact of transistor 24 through a resistor 27. The emitter contact of transistor 24 is further connected to primary winding 31 through a resistor 35. The base contact of transistor 24 is joined to the collector contact of transistor 22 and the collector contact of transistor 24 is connected to the base contact of transistor 22. A diode 28 and a resistor 30, in parallel, are connected serially between the base contact of transistor 22 and the cathode of diode 18, for example a zener diode. A resistor 32 is connected in series between a terminal 34, a voltage V, and the cathode of zener diode 18. A capacitor 36 is connected across zener diode 18, the anode of which is joined to return line 26.

As hereinafter described, a pulsed signal is presented at a terminal 38, at one side of secondary winding 33, one pulse occurring for each negative going transistion of the capacitor 16 voltage in current to count converter 14. A terminal 39 at the other side of secondary winding 33 receives a synch pulse that is coupled to primary winding 31 for turning on transistor 20 and discharging capacitor 16. By way of illustrative example of current to count converter 14 operation, it is assumed that initially, transistor 20 is in the conducting state and capacitor 16 is discharged. Transistor 20 is turned off and capacitor 16 is charged by the proportional current $i_1$. The voltage across capacitor 16 continues to rise until it reaches a potential that is equal to the sum of the voltage developed across zener diode 18 and the base to emitter voltage drop of transistor 22. At this time, transistor 22 begins to conduct and the resulting collector current turns on transistor 24. The current through transistor 24 builds up quickly and the cathode voltage of diode 28 is rapidly pulled down by one diode drop. Simultaneously, the emitter current of transistor 24 drives into the base contact of transistor 20 and primary winding 31. In consequence, a field is built up in transformer 29, transistor 20 is turned on and capacitor 16 is discharged. When capacitor 16 is discharged by slightly more than one diode drop, transistor 22 begins to turn off. Since transistor 24 has removed charges from capacitor 16 and capacitor 36, it contains a stored charge. Accordingly, transistor 24 continues, for a short time, to dump current into the base of transistor 20 for further discharging of capacitor 16 and to further build up the field in transformer 29. Transistor 20 continues to discharge capacitor 16 until the charge stored in transistor 24 and the energy stored in transformer 29 are disipated. When transistor 24 turns off, capacitor 16 is discharged and the cycle repeats. Transistor 24, zener diode 18, diode 28 and resistor 30 compensate for the nonlinearity caused by the nonzero ratio of the discharge time of capacitor 16 to its minimum charging time by decreasing the firing potential at the base of transistor 22 as frequency increases. It is to be noted that, when transistor 22 conducts, diode 28 is forward biased and resistor 30 is shorted out. Current to count converter 14 is temperature compensated by zener diode 18 and transistors 20, 24, the temperature coefficient of zener diode 18 being matched by the temperature coefficients characterizing the saturation voltage of transistor 20 and the base to emitter voltage drop of transistor 22. The pulsed signal presented at output terminal 38 has a frequency functionally related to the input voltage $e_1$, a pulse being generated for each negative going transition of the capacitor 16 voltage in current to count converter 14. For a fuller understanding of the invention, reference should be had in FIG. 2, wherein there is shown an analog to digital converter 40 incorporating a voltage-controlled oscillator of the aforementioned type.

Figure 2:
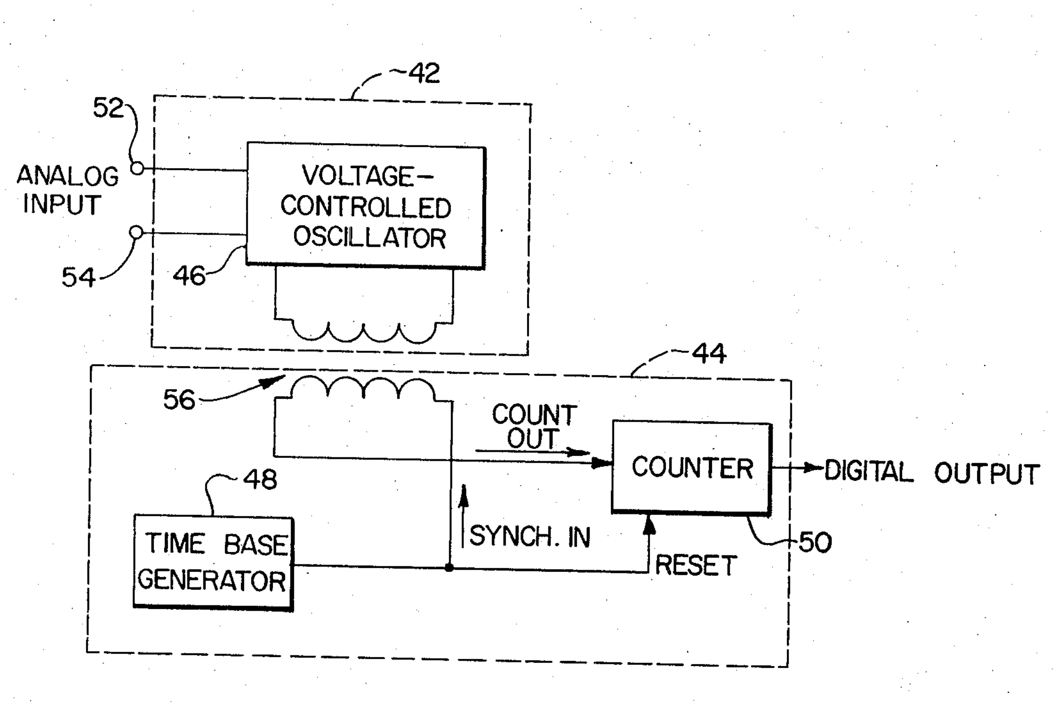
FIG. 2 is a block and schematic diagram of an analog to digital converter incorporating the voltage-controlled oscillator of FIG. 1.

Referring now to FIG. 2, it will be seen that analog to digital converter 40 comprises a floating analog section 42 and a grounded digital section 44. Analog section 42 includes a voltage-controlled oscillator 46 of the aforementioned type described in connection with FIG. 1 and digital section 44 includes a time base generator 48 and a counter 50. An analog signal applied to a pair of input terminals 52, 54 is converted to a count signal in voltage controlled oscillator 46 in the manner hereinbefore described. The pulsed signal or count signal is coupled through a transformer 56 and added to a timing signal generated by time base generator 48. Transformer 56 serves a dual function of coupling out the count signal and coupling a synch pulse to voltage-controlled oscillator 46 for synchronization of floating analog section 42 and grounded digital section 44. Counter 50, which is reset by the leading edge of the timing signal, is gated to respond to only those count pulses occuring within a selected time interval of the timing signal. A digital form signal representing the analog input signal is presented at the output of counter 50. For a fuller understanding of the interrelationships among voltage controlled oscillator 46, time base generator 48, counter 50 and transformer 56, reference should be had to FIGS. 3 and 4, wherein there is shown a digital meter 60 incorporating an analog to digital converter of the type depicted in FIG. 2.

Figure 3:
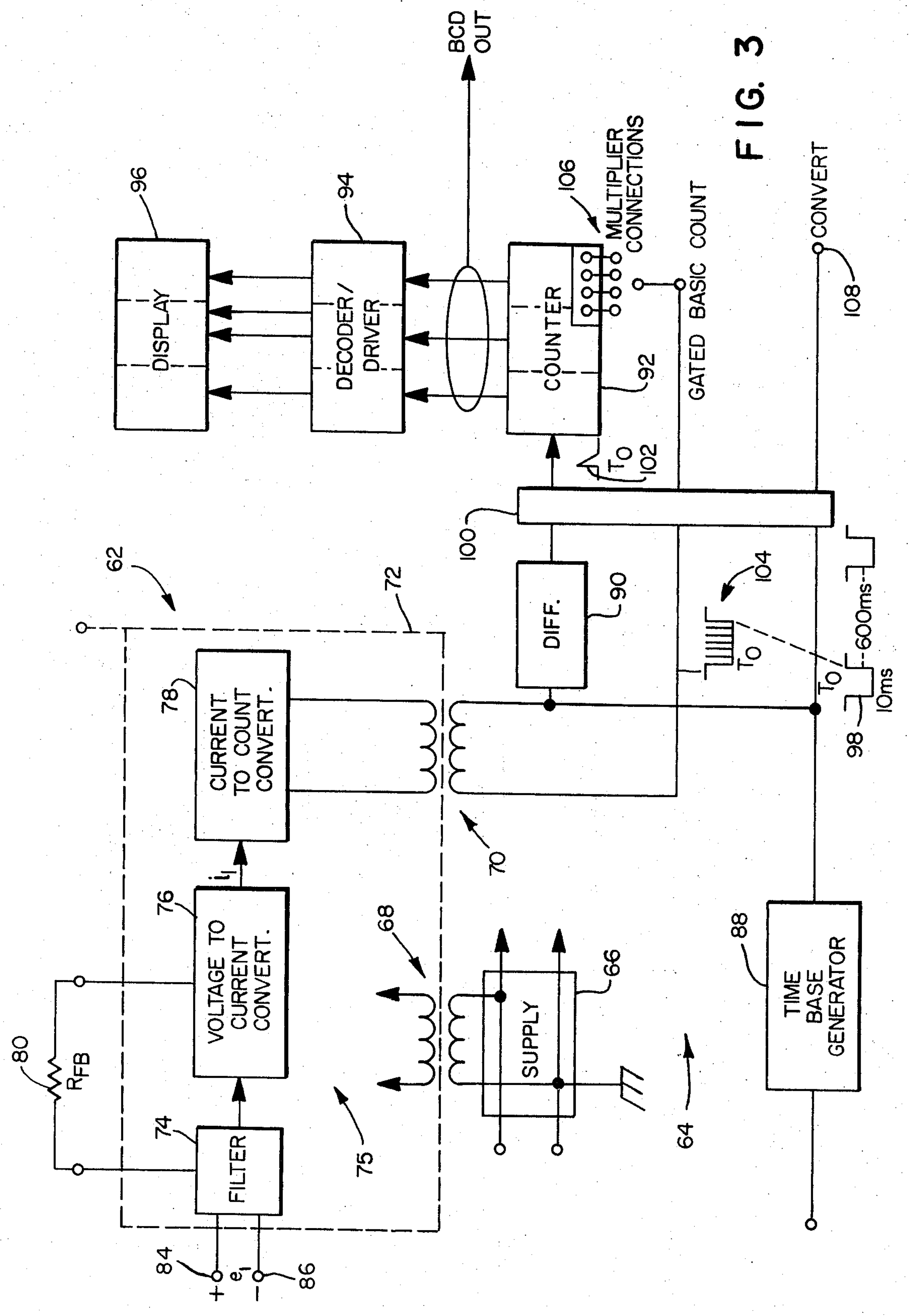
FIG. 3 is a block and shematic diagram of a digital panel meter incorporating the analog to digital converter of FIG. 2.

Referring now to FIG. 3, it will be seen that digital meter 60, for example a digital panel meter, comprises a floating analog section 62 and a grounded digital section 64 for presenting an unknown analog input signal in digital form. Power generated by a supply 66 is applied to grounded digital section 64 and is coupled to floating analog section 62 via a transformer 68. The count signal generated by analog section 62 is coupled to grounded digital section 64 via a coupling transformer 70 which also couples a synch pulse from digital section 64 to analog section 62 for synchronization of analog section 62 and digital section 64. An electrical guard line 72 passing around floating analog section 62 and through transformer 68 and coupling transformer 70 is provided for optimum external guard line connection. It is to be noted that, the only electrical coupling between floating analog section 62 and grounded digital section 64 is through transformer 68 and couping transformer 70, for example low capacitance transformers. Accordingly, floating analog section 62 is galvanically isolated from grounded digital section 64.

Floating analog section 62 comprises a filter 74 and a voltage-controlled oscillator 75 including a voltage to current converter 76 and a current to count converter 78. A feedback resistor 80, denoted $R_{FB}$, is serially connected between filter 74 and voltage to current converter 76. An input analog signal, $e_1$, derived from either a voltage source, or a shunt in series with a current to be measured or from the output of an attenuator, is applied to filter 74 via input terminals 84, 86. The analog input signal, within a range of 20 mv to 2.0v for example, is filtered and translated into a proportional current $i_1$. The proportional current $i_1$ is applied to current to count converter 78 and a number of count pulses C is generated. In the illustrated embodiment, by way of example, the number of count pulses C is one count pulse for each microampere of current $i_1$. That is, if $e_1$ is 500 millivolts and $R_{FB}$ is 1,000 ohms, then $i_1$ is 500 microamperes and the number of count pulses C is 500. The count pulses C are coupled through coupling transformer 70 to digital section 64.

Digital section 64 comprises, supply 66, a time base generator 88, a differentiator 90, a counter 92, a decoder/driver 94 and a display 96. Time base generator 88 generates a timing signal 98, for example stable 10 millisecond periods at approximately 600 millisecond intervals. The leading edge of timing signal 98 is differentiated in differentiator 90 and applied to counter 92 via an inverter unit 100. The differentiated signal, denoted by reference character 102, resets counter 92. The leading edge of timing signal 98 is coupled through coupling transformer 70 for synchronization of analog section 62 and digital section 64. The coupled count pulses are added to an inverted version of timing signal 98, shown at 104, and applied to counter 92. It will be readily appreciated that coupling transformer 70 couples the count pulses generated by voltage-controlled oscillator 75 to counter 92 and couples also the timing signal generated by time base generator 88 to current to count converter 78 for synchronization of floating analog section 62 and digital section 64 in order to eliminate random plus and minus count errors. The combined waveform of the coupled pulses an inverted timing signal is applied to counter 92 via inverting unit 100. Counter 92 is gated to respond to only those count pulses occuring in the lower level of the 10 millisecond interval of the timing signal. In consequence, counter 92 counts only those isolated synchronized countable pulses that occur within the 10 millisecond timing period. In the preferred embodiment, counter 92 is programmable and includes multiply interconnectors 106 which operate to program counter 92 to count by a multiplying factor M, 1, 2, 5, or 10, for example. Digital form signals at the output of counter 92, for example binary coded decimal form signals, are applied to display 96 via decoder/driver 94. In order to avoid blinking of display 96, for example a seven bar incadescent display, while counter 92 is counting, the time base interval signal is applied also to decoder/driver 94 via inverting unit 100 to energize all bars in the seven bar incandescent display, those bars illuminated during the counting cycle exhibiting a higher luminance than those bars energized by the inverted timing signals. The timing signal is presented at a terminal 108 as a convert signal pulse for external system circuitry. The unknown analog signal is presented on display 96 in digital form as the number of pulses C times the multiplying factor M. Selective programming of interconnectors 106 and decoder/driver 94, with the ability to scale $i_1$ with respect to $e_1$ by $R_{FB}$, provide arbitrary scaling of the analog input signal, whereby the digital form signal presented by display 96 is in arbitrary engineering units. For a fuller understanding of the invention, reference should be had to the desired circuitry shown in FIG. 4.

Figure 4:
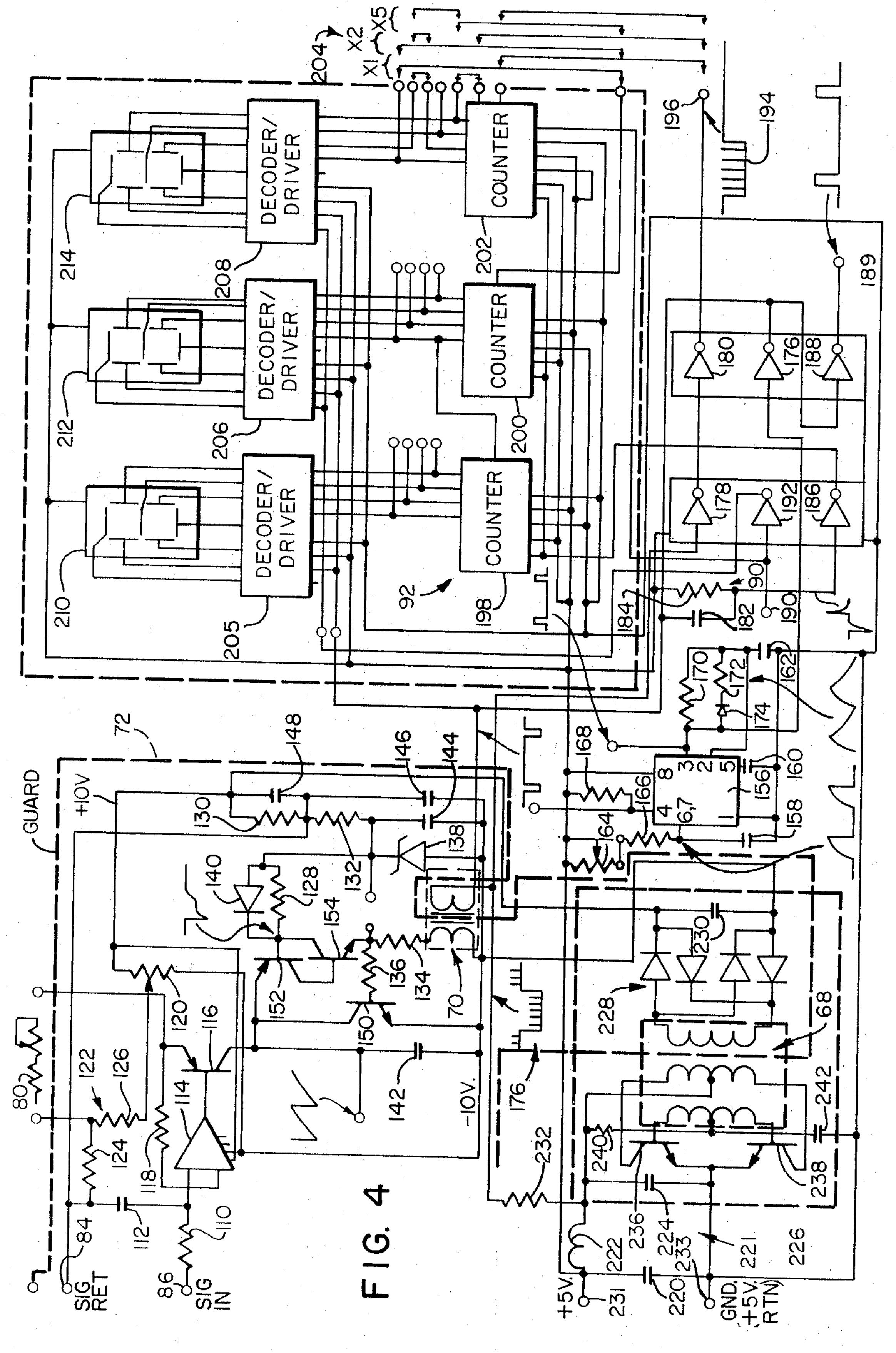
FIG. 4 is a detailed schematic diagram of the digital panel meter of FIG. 3.

Referring now to FIG. 4, it will be seen that filter 74 includes a resistor 110 and a capacitor 112. Resistor 110 serves the dual function of current limiter and filter element. The filtered voltage is applied to voltage to current converter 76 which includes an operational amplifier 114 and a transistor 116. Feedback to operational amplifier 114, for example a low bias current, high gain operational amplifier, is taken from the emitter contact of transistor 116 through a resistor 118. An offset voltage at the wiper arm of a variable resistor 120 is reference to signal return at terminal 84 by means of a divider 122, resistors 124 and 126, and is fed back to operation amplifier 114 for zero control thereof via resistors 80 and 118. Due to the feedback circuit, the voltage at the emitter of transistor 116 closely equals the analog input voltage $e_1$ and the current passing through transistor 116 closely equals $e_1$ divided by the feedback resistance of resistors 126 and 80, the resistance of resistor 124 being negligible with respect to the resistance of resistor 126. Accordingly, voltage to current converter 76 translates the analog input voltage $e_1$ into a proportional current $i_1$ which is applied current to count converter 78.

Current to count converter 78 comprises resistors 128, 130, 132, 134 and 126; diodes 138 and 140; capacitors 142, 144, 146 and 148; and transistors 150, 152 and 154. Capacitors 146 and 148 are connected across supply 66 and function as filter capacitors which steady the supply voltage. Although the operation of current to count converter 78 is similar to that of current to count converter 14, the following examplary description provides a further understanding of digital panel meter 60. Initially, transistor 150 is in the conducting state and capacitor 142 is discharged. Thereafter, transistor 150 is turned off and capacitor 142 is charged by the proportional current $i_1$. The voltage across capacitor 142 continues to rise until it reaches a potential equal to the sum of the voltage developed across diode 138 plus the base to emitter voltage drop ($V_{BE}$) of transistor 152. Diode 138, for example a zener diode, is nominally 5.6v and the $V_{BE}$ drop of transistor 152 is approximately 0.65V. Accordingly, when the voltage across capacitor 142 rises to approximately 6.25V, transistor 152 begins to conduct. As soon as transistor 152 begins to conduct, its resulting collector current commences to turn on transistor 154. In turn, the collector current of transistor 154 pulls down the base of transistor 152. Transistors 152 and 154 are very high speed transistors and a rapid regenerative action takes place. There is a very rapid current built up in transistor 154, whereby the cathode point of diode 92 is pulled down very rapidly by one diode drop. At the same time, the emitter current of transistor 154 drives into the base of transistor 150 via resistor 136 and into coupling transformer 70 via resistor 134. In consequence, a field is built up in the winding of coupling transformer 70. Transistor 150 now proceeds to discharge capacitor 142 very rapidly. As soon as capacitor 142 is discharged by slightly greater than one diode drop, transistor 152 begins to turn off, signaling the termination of the regenerative action. Transistor 154 has removed charge from both capacitors 142 and 144, and therefore, has a certain stored charge within it. Due to this stored charge, transistor 154 continues, for a short time, to dump current into the base of transistor 150 and to further build up the field in the winding of coupling transformer 70. Transistor 150 continuEs to discharge capacitor 142 until the stored charge in transistor 154 and the energy stored in the winding of coupling transformer 70 is dissipated. Capacitor 142 is fully discharged to the saturation voltage of transistor 150. Transistor 150 is turned off and the cycle repeats. In the illustrated embodiment, the entire regenerative and discharge time is approximately 40 nanoseconds.

Anti-lock-up protection of current to count converter 78 is provided by resistor 134 which is connected serially between the emitter of transistor 154 and coupling transformer 70. It should be clear that, any time transistor 154 conducts, it tends to pull current from supply 66 through diode 140 and resistors 130 and 132. The resistance of resistors 130 and 132 are such that, if transistor 154 attempts to conduct on a steady state basis, the voltage developed across resistor 134 is higher than the base emitter turn on voltage of transistor 150. Therefore, transistor 150 is turned on and capacitor 142 is discharged. Since transistor 152 cannot conduct unless its emitter voltage is higher than its base voltage, transistor 152 is turned off. In consequence, transistor 154 is turned off. Accordingly, this simple arrangement provides anti-lock-up protection.

As previously indicated, digital section 14 includes supply 66 and time base generator 88. Supply 66 comprises an input filter 220, an LC filter 221, a high frequency oscillator 226 a rectifier 228 and an output filter 230. LC filter 221, which operates to isolate the input voltage at terminals 231, 233 from oscillator 226, includes an inductor 222 and a capacitor 224. Oscillator driver 226 includes transistors 236 and 238, a resistor 240, a capacitor 242 and transformer 68. The detailed circuitry of time base generator 88 is shown in FIG. 5, reference characters 1, 2, 3, 4, 5, 6, 7 and 8 denoting terminals.

Figure 5:
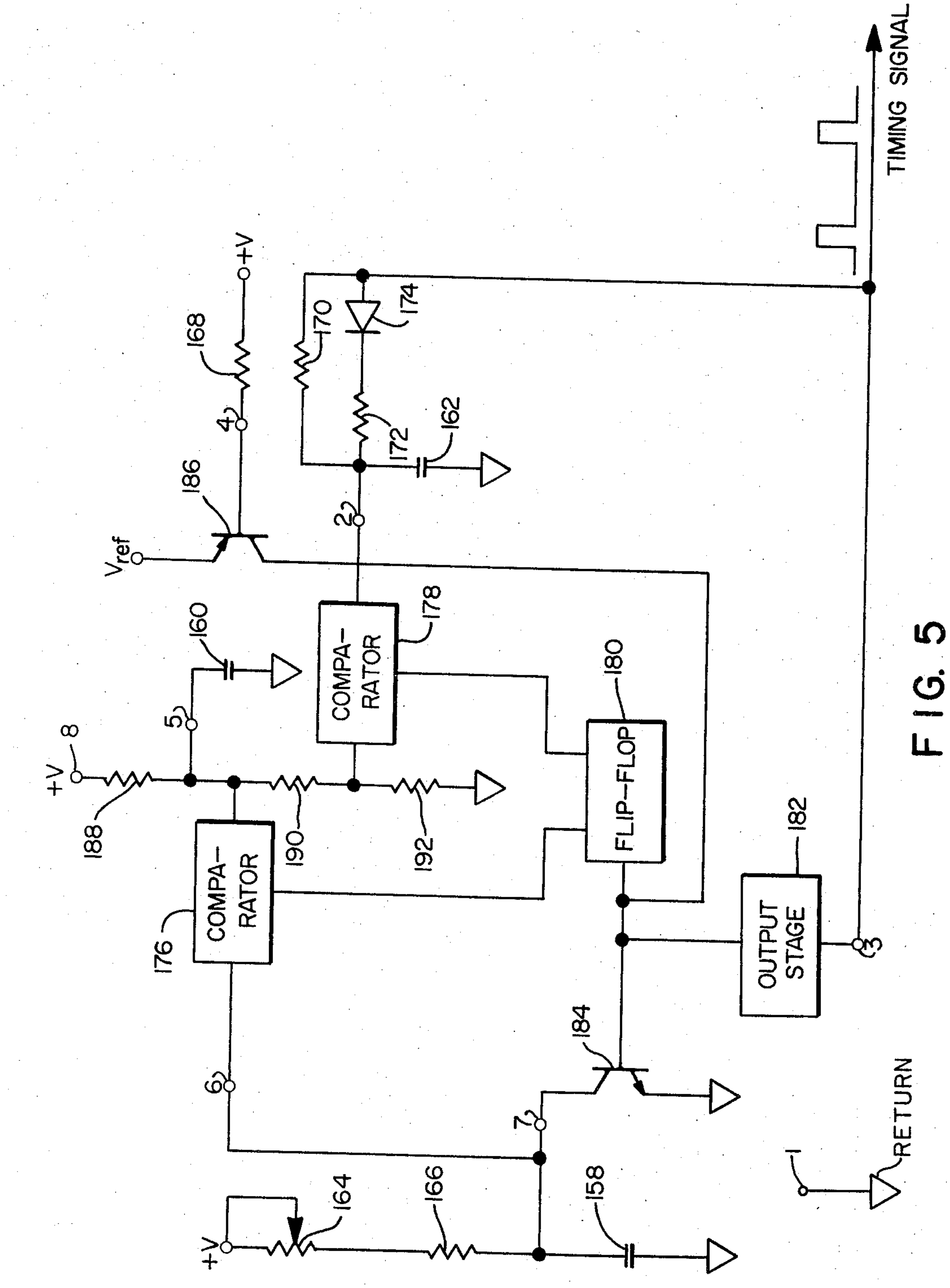
FIG. 5 is a schematic diagram of the timer of FIG. 4.

Referring now to FIG. 5, it will be seen that timer 156 comprises comparators 176 and 178; a flip-flop 180; an output stage 182; transistors 184 and 186; and resistors 188, 190 and 192 and an inverter 194. In the following exemplary discussion of timer 156 operation, for convenience, is assumed that flip-flop 180 is in a first state, the signal at the base of transistor 184 is low, and the signal generated by output stage 182 is high. Transistor 184 is turned off and capacitor 158 is charged by the current applied thereto through resistors 164 and 166. Simultaneously, capacitor 162 is charged by the high signal generated by output stage 182 and applied thereto through diode 174 and resistor 172. When the voltage across capacitor 158 reaches a specified level, for example two-thirds of the supply voltage, comparator 176 generates a signal which triggers flip-flop 180 into a second state. The signal at the base of transistor 184 goes high and the signal generated by output stage 182 is low. Transistor 184 is turned on and capacitor 158 is discharged. Capacitor 162 is discharged through resistor 170. When capacitor 162 is discharged to a specified level, for example one-third of the supply voltage, comparator 178 generates a signal which sets flip-flop 180 to the first stage. Astable operation of timer 156 continues. From the foregoing, it will be readily appreciated that capacitor 158 controls the width of the 10 millisecond pulse period and capacitor 162 controls the 600 millisecond interpulse period of the timing signal. As previously described, the frequency of the count pulses generated by current to count converter 78 is dependent upon capacitor 142. Accordingly capacitance changes of capacitor 142 produce changes in the frequency of the count pulses and capacitance changes of capacitor 158 produce changes in the width of the timing signal. In order to compensate for frequency changes of the count pulses due to temperature, capacitor 158 has a temperature coefficient which tracks the temperature coefficient of capacitor 142. That is, if the frequency of the count pulses changes due to the effects of temperature on capacitor 142, there is a counteracting change in the 10 millisecond pulse period due to the effects of temperature on capacitor 158. For example, if the capacitance of capacitors 142 and 158 increases due to temperature, the frequency of the count pulses decreases and the 10 millisecond pulse period increases. In consequence, the decrease in the frequency of the count pulses is compensated by a counteracting increase in the counting time interval.

An inverted version of the timing signal at an output terminal of an inverter 176 is applied to transformer 70 for synchronizing analog section 62 and digital section 64. As the inverted timing signal goes negative, current is pulsed through transformer 70, pulses on the primary thereof turn on transistor 150 and capacitor 142 is discharged. That is, capacitor 142 is discharged at the beginning of each counting time interval. The width of the coupled signal is determined by the time constant of the inductance of transformer 70 and a resistor 232. In other words, time base generator 88 operates as a clock for digital section 64 and as a repetitive zeroing input for voltage-controlled oscillator 75. The count signals, one count signal generated for each negative going transistion of the capacitor 142 voltage in voltage-controlled oscillator 75, are coupled through transformer 70 and added to an inverted version of the timing signal as at the output terminal of an inverter 176. This combined waveform, shown at 177, is applied to counter 92 via inverters 178 and 180. It is to be noted that, the inverted version of the timing signal as at the output terminal of inverter 176 is differentiated in differentiator 90, a capacitor 182 and a resistor 184, and is applied as a reset signal to counter 92 via an inverter 186. The inverted timing signal at the output terminal of inverter 176 is inverted in an inverter 188 and is presented as a convert signal for external system circuitry at a terminal 189. An external blank signal applied to a terminal 190 is fed to counter 92 and decoder/driver 94 via an inverter 192 for blanking display 96.

A gated count signal 194 as at a terminal 196 is selectively applied to counter 92, including counters 198, 200, and 202, via multiplier interconnectors 204. The signals generated by counters 198, 200 and 202 are applied to display 96 via decoder/driver 94. In the illustrated embodiment, decoder/driver 94 includes decoder/drivers 205, and 208, and display 96 includes seven bar incadescent displays 210, 212 and 214. Counter 202 generates the least significant bit which is applied to display 214 via decoder/driver 208 and counter 198 generates the most significant bit which is applied to display 210 via decoder/driver 205. The unknown analog signal at terminals 84, 86 is presented visually in digital form on display 94, multiply interconnectors 204 operating to program counter 92 for presenting the digital form signal in arbitrary engineering units.

Since certain changes may be made in the foregoing disclosure without departing from the scope of the invention herein involved, it is intended that all matter contained in the above description and depicted in the accompanying drawings be construed in an illustrative and not in a limiting sense.

What is claimed is:

1. A device for generating an output signal having a frequency related to a characteristic of an input signal, said device comprising:

a. first means through which said input signal is applied;
b. capacitor means operatively connected to said first means, said capacitor means having charged and discharged states;
c. second means operatively connected to said first means and said capacitor means, said second means having first and second conditions, said second means including non-linearity compensating means and temperature compensating means;
d. third means including a transformer operatively connected to said second means; and
e. output means operatively connected to said third means;
f. said capacitor means in its discharged state and said second means in its first condition, said input signal applied to said capacitor means through said first means and said capacitor means dynamically changing into its charged state, said second means changing to its second condition in response to said capacitor means dynamically changing into its charged state, said capacitor means dynamically changing into its discharged state in response to said second means changing to its second condition, said non-linearity compensating means operating to compensate for non-linearity caused by the non-zero ratio of the discharge time of said capacitor means to its mimimum charging time, a pulse generated by said second means coupled to said output means through said third means for each negative going transistion of said capacitor means, successive pulses occurring at a frequency functionally related to a characteristic of said input signal being presented at said output means.

2. The device as claimed in claim 1 wherein said second means includes:
a. first transistor means having a base contact, an emitter contact and a collector contact, said capacitor means connected across said collector and emitter contacts of said first transistor means, said collector contact connected to said first means;
b. second transistor means having a base contact, an emitter contact and a collector contact, said emitter contact of said second transistor means connected to said first means;
c. third transistor means having a base contact an emitter contact and a collector contact, said base contact of said third transistor means connected to said collector contact of said second transistor means, said base contact of said second transistor means connected to said collector contact of said third transistor means, said emitter contact of said third transistor means operatively connected to said base contact of said first transistor means and said fourth means;
d. resistor means;
e. first diode means; and
f. zener diode means;
g. said resistor means and said first diode means, in parallel, connected serially between said zener diode means and said base contact of said second transistor means;
h. said non-linearity compensating means including said third transistor, said first diode means, said resistor means and said zener diode means, said non-linearity compensating means operating to compensate for the non-zero ratio of the discharge time of said capacitor means to its charging time by decreasing the firing potential at said base contact of said second transistor means as frequency increases;
i. said temperature compensating means including said zener diode means and said first and third transistor means, the temperature coefficient of said zener diode means matched by the temperature coefficients characterizing the saturation voltage of said first transistor means and the base to emitter voltage drop of said second transistor means.

3. The device as claimed in claim 1 wherein said first means includes voltage to current converter means for translating said input signal to a proportional current.

4. A device for converting an analog input signal to a digital output signal, said device comprising:
a. means for receiving said analog input signal and for generating a pulsed signal having counting pulses occurring at a rate functionally related to a characteristic of said analog input signal, said means for receiving and for generating said pulsed signal including
i. first means through which said analog input signal is applied;
ii. capacitor means operatively connected to said first means, said capacitor means having charged and discharged states;
iii. second means operatively connected to said first means and said capacitor means, said second means having first and second conditions, said second means including non-linearity compensating means and temperature compensating means; and
iv. third means operatively connected to said second means;
v. said capacitor means in its discharged state and said second means in its first condition, said input signal applied to said capacitor means through said first means and said capacitor means dynamically changing into its charged state, said second means changing to its second condition in response to said capacitor means dynamically changing into its charged state, said capacitor means dynamically changing into its discharged state in response to said second means changing to its second condition, said non-linearity compensating means operating to compensate for non-linearity caused by the non-zero ratio of the discharge time of said capacitor means to its minimum charging time, a counting pulse generated by said second means coupled through said third means for each negative going transition of said capacitor means, successive counting pulses occurring at a frequency functionally related to a characteristic of said analog input signal being coupled through said third means;
b. means for generating a timing signal having a gating pulse occurring at selected intervals and for generating said digital output signal as a function of the number of counting pulses occurring within said gating pulse;
c. said third means operatively connected to said means for generating said timing signal for coupling said pulsed signal to said means for generating said timing signal and for coupling said timing signal to said means for generating said counting pulses, said coupled timing signals synchronizing said means for generating said counting pulses and said means for generating said timing signal.

5. The device as claimed in claim 4 wherein said means for generating said counting pulses is floating analog section means and said means for generating said timing signal is grounded digital section means.

6. The device as claimed in claim 5 wherein said floating analog section means includes voltage to current converter means for translating said analog input signal into a proportional current.

7. The device as claimed in claim 5 wherein said grounded digital section means includes timer means and counter means, said timer means generating said timing signal and said counter means gated to respond to only those counting pulses occuring within said gating pulse, said counter means generating said digital output signal.

8. The device as claimed in claim 4 wherein said means for generating said counting pulses is floating analog section means and said means for generating said timing signal is grounded digital section means, said capacitor means controlling the rate at which said counting pulses occur, said grounded digital second means including timer means for generating said timing signal and counter means for generating said digital output signal defined by the number of counting pulses occuring within said gating pulse, said timer means having fourth means for controlling the width of said gating pulse, changes in the rate at which said counting pulses occur due to the effects of temperature counteracted by a compensating change in the width of said gating pulse.

9. The device as claimed in claim 8 wherein said third means is coupling transformer means establishing a common path for said pulsed signal and said timing signal.

10. The device as claimed in claim 8 wherein said means for generating said counting pulses includes voltage to current converter means for translating said analog input signal to a porportional current and current to count converter means for converting said proportional current to said counting pulses, said current to count converter means including said first means, said capacitor means, and said third means.

11. The device as claimed in claim 8 wherein said capacitor means is a first capacitor and said fourth means is a second capacitor, said first and second capacitors having tracking temperature coefficients.

12. The device as claimed in claim 4 wherein said second means includes:

a. first transistor means having a base contact, an emitter contact and a collector contact, said capacitor means connected across said collector and emitter contacts of said first transistor means, said collector contact connected to said first means;

b. second transistor means having a base contact, an emitter contact and a collector contact, said emitter contact of said second transistor means connected to said first means;

c. third transistor means having a base contact, an emitter contact and a collector contact, said base contact of said third transistor means connected to said collector contact of said second transistor means, said base contact of said second transistor means connected to said collector contact of said third transistor means, said emitter contact of said third transistor means operatively connected to said base contact of said first transistor means and said third means;

d. resistor means;

e. first diode means; and f. zener diode means;

g. said resistor means and said first diode means, in parallel, connected serially between said zener diode means and said base contact of said second transistor means;

h. said non-linearity compensating means including said third transistor, said first diode means, said resistor means and said zener diode means, said non-linearity compensating means operating to compensate for the non-zero ratio of the discharge time of said capacitor means to its charging time by decreasing the firing potential at said base contact of said second transistor means as frequency increases;

i. said temperature compensating means including said zener diode means and said first and third transistor means, the temperature coefficient of said zener diode means matched by the temperature coefficients characterizing the saturation voltage of said first transistor means and the base to emitter voltage drop of said second transistor means.

13. A digital meter for presenting an analog input signal in digital form, said digital meter comprising:

a. analog means for receiving said analog input signal and for generating a pulsed signal having counting pulses occurring at a rate functionally related to a characteristic of said analog input signal, said analog means including i. first means through which said analog input signal is applied;

ii. capacitor means operatively connected to said first means, said capacitor means having charged and discharged states;

iii. second means operatively connected to said first means and said capacitor means, said second means having first and second conditions, said second means including non-linearity compensating means and temperature compensating means; and iv. third means including a transformer operatively connected to said second means;

v. said capacitor means in its discharged state and said second means in its first condition, said input signal applied to said capacitor means through said first means and second capacitor means dynamically changing into its charged state, said second means changing to its second condition in response to said capacitor means dynamically changing into its charged state, said capacitor means dynamically changing into its discharged state in response to said second means changing to its second condition, said non-linearity compensating means operating to compensate for non-linearity caused by the non-zero ratio of the discharge time of said capacitor means to its minimum changing time, a counting pulse generated by said second means coupled through said third means for each negative going transition of said capacitor means, successive counting pulses occurring at a frequency functionally related to a characteristic of said analog input signal being coupled through said third means;

b. digital means for generating a timing signal having a gating pulse occurring at selected intervals and for generating an intermediate signal functionally related to the number of counting pulses occurring within said gating pulse;

c. said third means operatively connected to said digital means, said third means establishing a common path for coupling said pulsed signal to said digital means and for coupling said timing signal to said analog means, said coupled timing signals synchronizing said analog means and said digital means; and d. display means operatively connected to said digital means for visually presenting said intermediate signal in digital form.

14. The digital meter as claimed in claim 13 wherein said analog means is floating analog means and said digital means is grounded digital means.

15. The digital meter as claimed in claim 14 wherein said floating analog means includes voltage to current converter means for generating a proportional current functionally related to a characteristic of said analog input signal and current to converter means for converting said proportional current to said counting pulses, said current to converter means including said first means, said capacitor means and said third means.

16. The digital meter as claimed in claim 15 wherein said grounded digital means includes timer means and counter means, said timer means generating said timing signal and said counter means gated to respond to only those pulses occuring within aid gating pulse, said counter means generating said intermediate signal.

17. The digital meter as claimed in claim 13 wherein said analog means is floating analog means and said digital means is grounded digital means, said capacitor means controlling the rate at which said counting pulses occur, said grounded digital means including timer means for generating said timing signal and counter means for generating said intermediate signal defining the number of counting pulses occurring within said gating pulse, said timer means having fourth means for controlling the width of said gating pulse, changes in the rate at which said counting pulses occur due to the effects of temperature counteracted by a compensating change in the width of said gating pulse.

18. The digital meter as claimed in claim 17 wherein said capacitor means is a first capacitor and said fourth means is a second capacitor, said first and second capacitors having tracking temperature coefficients.

19. A digital panel meter comprising:

a. floating analog section means including voltage to current converter means and current to count converter means;

b. grounded digital means including timer means, counter means and display means; and c. transformer coupling means operatively connecting said floating analog section means and said grounded digital section means, said coupling means establishing a common path between said floating analog section means and said grounded digital section means;

d. said voltage to current converter means receiving an analog input signal and generating a current functionally related to a characteristic of said analog input signal;

e. said current to count converter means receiving said current and generating a pulsed signal having repetitive counting pulses occurring at a frequency functionally related to said current;

f. said timer means generating a timing signal having a gating pulse occuring at selected intervals;

g. said couting signal coupled to said grounded digital section means via said coupling means and added to said timing signal, said timing signal coupled to said grounded digital section means via said coupling means for synchronizing said floating analog section means and said grounded digital section means;

h. said counter means responsive to only those counting pulses occuring within said gating pulse, said counter means generating a digital signal related to a characteristic of said analog input signal;

i. said digital signal applied to said display means, said analog input signal presented by said display means in digital form.

20. The digital panel meter as claimed in claim 19 wherein said grounded digital section means includes multiplier means operatively connected to said counter means, said digital signal defining said analog signal in engineering units.

21. The digital panel meter as claimed in claim 19 wherein said current to count converter means includes first compensating means and wherein said timer means includes second compensating means, a characteristic change of said first compensating means due to the effects of temperature varying the frequency of said counting pulses, a characteristic change of said second compensating means due to the effect of temperature varying the width of said gating pulse, variation in the frequency of said counting pulses due to the effects of temperature compensated by a counteracting variation in the width of said gating pulse due to the effects of temperature.

* * * * *